United States Patent
Arami et al.

[11] Patent Number: 5,958,140
[45] Date of Patent: Sep. 28, 1999

[54] ONE-BY-ONE TYPE HEAT-PROCESSING APPARATUS

[75] Inventors: Junichi Arami, Tokyo; Kenji Ishikawa, Sagamihara; Masayuki Kitamura, Tokyo, all of Japan

[73] Assignee: Tokyo Electron Limited, Tokyo, Japan

[21] Appl. No.: 08/686,604

[22] Filed: Jul. 26, 1996

[30] Foreign Application Priority Data

Jul. 27, 1995 [JP] Japan .................................... 7-210973

[51] Int. Cl.$^6$ ................................................. C23C 16/00
[52] U.S. Cl. ........................... 118/725; 118/715; 156/345
[58] Field of Search ............................. 156/345; 118/715, 118/724, 725

[56] References Cited

U.S. PATENT DOCUMENTS

| | | | |
|---|---|---|---|
| 4,741,801 | 5/1988 | Coleman | 156/345 |
| 5,127,988 | 7/1992 | Kawamura et al. | 156/345 |
| 5,273,588 | 12/1993 | Foster et al. | 118/723 |
| 5,304,250 | 4/1994 | Sameshima et al. | 118/723 |
| 5,443,689 | 8/1995 | Kimura et al. | 216/63 |

FOREIGN PATENT DOCUMENTS

| | | |
|---|---|---|
| 59-124140 | 7/1984 | Japan . |
| 63-32930 | 2/1988 | Japan . |
| 63-160355 | 7/1988 | Japan . |
| 3-97222 | 4/1991 | Japan . |
| 6-177231 | 6/1994 | Japan . |
| 7-10665 | 1/1995 | Japan . |
| 7-273101 | 10/1995 | Japan . |

*Primary Examiner*—Bruce Brenerman
*Assistant Examiner*—Alva C Powell
*Attorney, Agent, or Firm*—Oblon, Spivak, McClelland, Maier & Neustadt, P.C.

[57] ABSTRACT

A one-by-one type heat-processing apparatus is disclosed. The one-by-one type heat-processing apparatus includes a processing vessel for processing a semiconductor wafer. A susceptor having a support surface for placing the semiconductor wafer is arranged in the processing vessel. A shower head section is arranged at an interval with respect to the support surface of the susceptor. Processing gas supply pipes for supplying a processing gas are independently connected to the shower head section. A plurality of gas injection holes are formed in the shower head section. First to third heating means for heating the susceptor are attached to the susceptor. The first heating means having a disk-like shape is arranged at almost the center on the lower surface side of the susceptor. The second heating means is concentrically arranged to surround the first heating means. The third heating means is arranged at the peripheral edge portion of the susceptor. The diameter of a gas injection region having the plurality of gas injection holes on the surface of the shower head section opposite to the susceptor is substantially equal to the diameter of the third heating means. The apparatus also includes a central control section capable of independently controlling the first to third heating means.

22 Claims, 7 Drawing Sheets

CONCENTRATION OF $SiH_4$ GAS

A: $7.4 \times 10^{-4}$
B: $1.4 \times 10^{-3}$
C: $2.0 \times 10^{-3}$
D: $2.6 \times 10^{-3}$
E: $2.9 \times 10^{-3}$
F: $3.3 \times 10^{-3}$

F I G. 8

CONCENTRATION OF $SiH_4$ GAS

A: $7.4 \times 10^{-4}$
B: $1.4 \times 10^{-3}$
C: $2.0 \times 10^{-3}$
D: $2.6 \times 10^{-3}$
E: $2.9 \times 10^{-3}$

F I G. 9

CONCENTRATION OF $SiH_4$ GAS

A: $7.4 \times 10^{-4}$
B: $1.4 \times 10^{-3}$
C: $2.0 \times 10^{-3}$
D: $2.6 \times 10^{-3}$
E: $2.9 \times 10^{-3}$

FIG. 10

CONCENTRATION OF $SiH_4$ GAS

A: $7.4 \times 10^{-4}$
B: $1.4 \times 10^{-3}$
C: $2.0 \times 10^{-3}$
D: $2.6 \times 10^{-3}$
E: $2.9 \times 10^{-3}$

ONE-BY-ONE TYPE HEAT-PROCESSING APPARATUS

BACKGROUND OF THE INVENTION

1. Field of the Invention

The present invention relates to a one-by-one type heat-processing apparatus and, more particularly, to a one-by-one type heat-processing apparatus for forming a film on the surface of a target object.

2. Description of the Related Art

Generally, in a process of manufacturing a semiconductor integrated circuit, film formation and patterning by photolithography are repeatedly performed for a target object such as a semiconductor wafer or a glass substrate, thereby forming a desired device on the target object.

Processing apparatuses used to form films on target objects include a batch type apparatus and a one-by-one type apparatus. The batch type heat-processing apparatus can process a large number of target objects at once. On the other hand, the one-by-one type heat-processing apparatus can process target objects one by one. These two types of apparatuses are properly selected and used in accordance with, e.g., the quality or type of a film to be formed.

Figure 1:
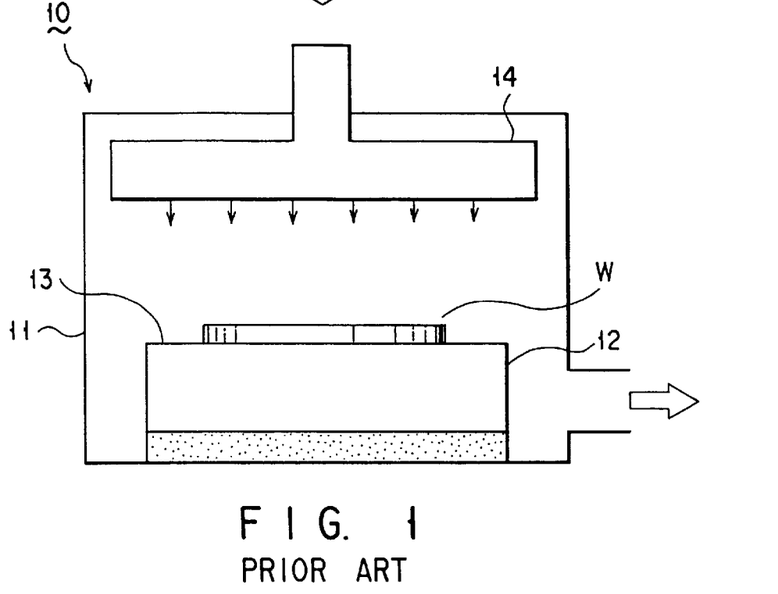
FIG. 1 is a view showing the schematic arrangement of a conventional one-by-one type heat-processing apparatus.

A one-by-one type CVD apparatus used to form a film on a semiconductor wafer will be described below. As shown in FIG. 1, a CVD apparatus 10 comprises a processing vessel 11. A susceptor 12 is arranged in the processing vessel 11. A semiconductor wafer W can be placed on a support surface 13 of the susceptor 12. The semiconductor wafer W can be fixed by a fixing means such as an electrostatic chuck. A shower head section 14 is arranged above the support surface 13 to be parallel and opposite to the support surface. A processing gas supplied from a processing gas supply source (not shown) is supplied into the processing vessel 11 via the shower head section 14.

Film formation processing is performed by supplying the processing gas into the processing vessel 11 via the above-described shower head section 14 while keeping the process pressure in the processing vessel 11 and the wafer W at the process temperature. By this film formation processing, a film consisting of a predetermined material such as polysilicon or silicon oxide can be formed on the surface of the semiconductor wafer.

To obtain a large number of devices excellent in electrical characteristics in manufacturing semiconductor devices, films having proper characteristics must be formed. The in-plane uniformity of the film thickness of a wafer is the most important characteristic of them.

There are a large number of parameters to control the film thickness. These parameters include the process pressure, the process temperature, the supply amount of a processing gas, the wafer size, the size of each portion of a processing apparatus. These parameters are not independent of each other but related to each other. Therefore, it is difficult to uniquely determine the optimum values of these parameters. The optimum film formation conditions have conventionally been prepared from the results obtained by actually, repeatedly performing film formation processing under various design conditions for an apparatus and various processing conditions.

At present, as for 6" wafers, films can be formed with high in-plane uniformity of the film thickness of the wafers. In recent years, however, the diameters of semiconductor wafers tend to be increased. If the diameters of semiconductor wafers are increased from 6 inches to 8 or 12 inches, the film formation conditions for 6" wafers may not be directly applied to the wafers having larger diameters. In addition, thinner, higher-quality films are required to be formed due to demands for increases in integration and density of semiconductor devices. However, it is difficult to meet these demands by processing apparatus for 6" wafers.

SUMMARY OF THE INVENTION

It is an object of the present invention to provide a one-by-one type heat-processing apparatus capable of forming a film on a target object with high in-plane uniformity of the film thickness. More specifically, the present invention provides a one-by-one type heat-processing apparatus comprising: a processing vessel for processing a target object; a support member arranged in the processing vessel and having a support surface for placing the target object; a shower head section arranged spaced apart from the support surface; processing gas supply means for supplying a processing gas to the shower head section; a plurality of gas injection holes formed in the shower head section; and heating section attached to the support member to heat the support member, wherein a maximum length of a gas injection region having the plurality of gas injection holes on a surface of the shower head section opposite to the support member is substantially equal to a maximum length of a gas reaction region heated to at least a temperature at which the processing gas starts reaction.

The present invention provides a one-by-one type heat-processing apparatus comprising: a processing vessel for processing a target object; a support member arranged in the processing vessel and having a support surface for placing the target object; a shower head section arranged spaced apart from the support surface; processing gas supply means for supplying a processing gas to the shower head section; a plurality of gas injection holes formed in the shower head section; a plurality of heating means for divisionally heating a plurality of regions of the support member; and control means for independently controlling the plurality of heating means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

An embodiment of the present invention will be described below with reference to the accompanying drawings.

Figure 2:
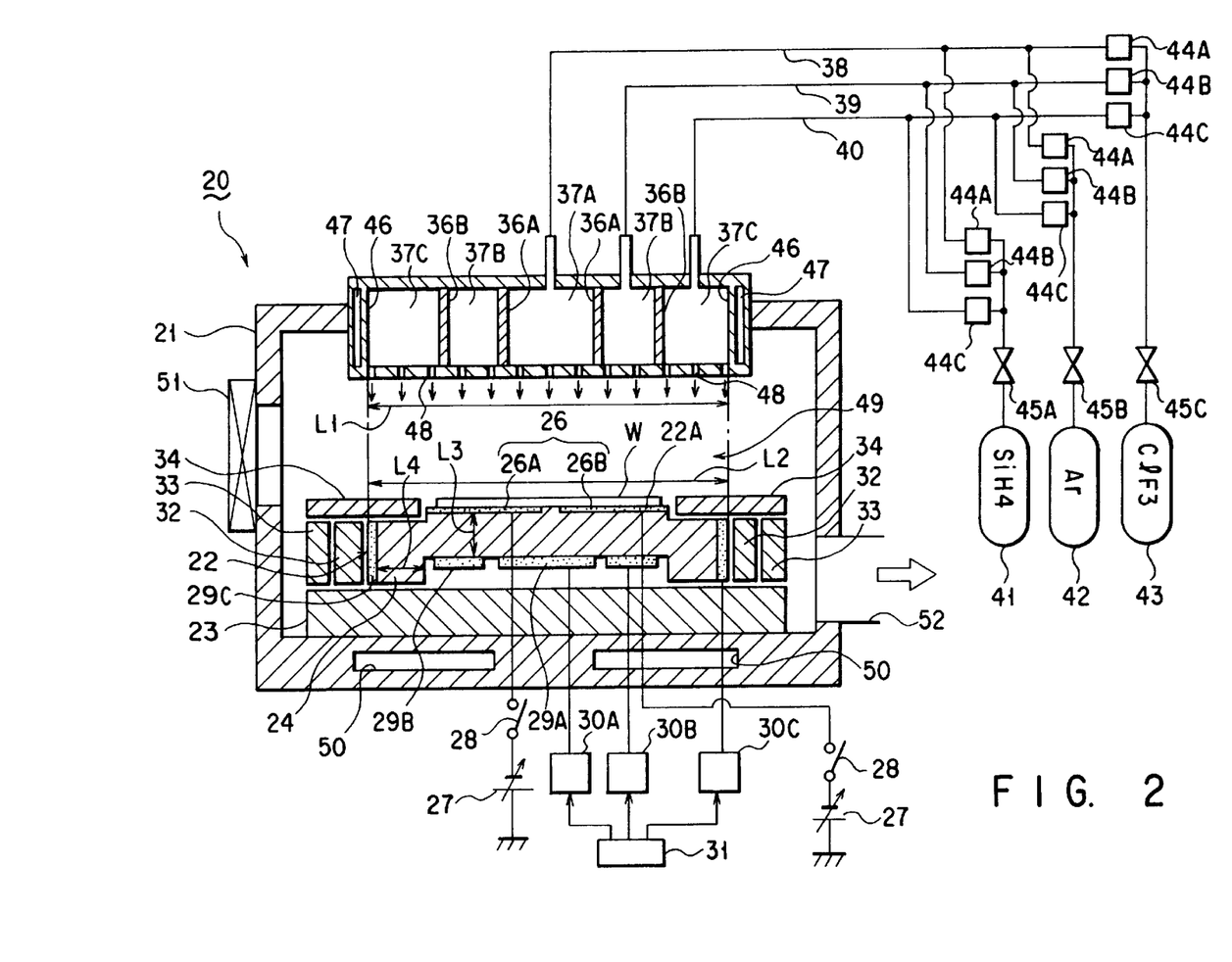
FIG. 2 is a sectional view showing a CVD apparatus according to an embodiment of the present invention.

FIG. 2 is a sectional view showing a one-by-one type heat-processing apparatus according to an embodiment of the present invention. The processing apparatus according to this embodiment is a one-by-one type heat-processing apparatus of a resistance heating scheme. A CVD apparatus 20 comprises a processing vessel 21. The processing vessel 21 is an airtight vessel, which consists of, e.g., aluminum and has a cylindrical or box-like shape. A susceptor 22 for supporting a thick target object such as a semiconductor wafer is arranged in the processing vessel 21. The susceptor 22 is set on the bottom portion of the processing vessel 21 via a heat insulator 23 consisting of, e.g., opaque silica.

Figure 3:
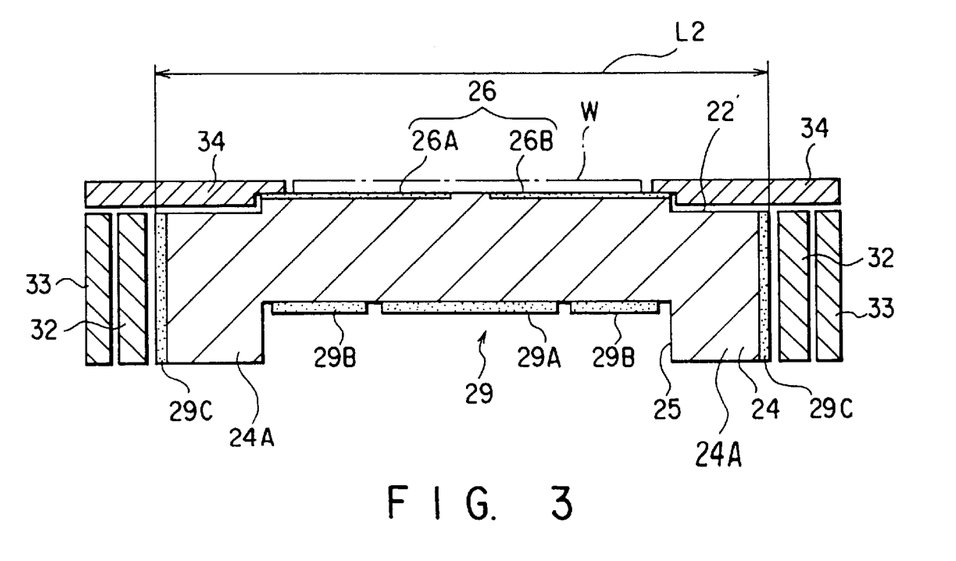
FIG. 3 is a sectional view showing a portion near the susceptor of the CVD apparatus shown in FIG. 2.

FIG. 3 is a sectional view showing a portion near the susceptor 22 of the CVD apparatus 20 shown in FIG. 2. As shown in FIG. 3, the susceptor 22 comprises a susceptor main body 24. The susceptor main body 24 has a substantially columnar shape. A recessed portion 25 is formed in the central portion of the lower surface of the susceptor main body 24. The susceptor main body 24 consists of a material having a high thermal conductivity such as boron nitride, and its surface is coated with pyrolytic boron nitride and silica. The susceptor 22 has a thickness of 10 to 30 cm and is set larger in diameter than the semiconductor wafer W by 5 to 20 cm.

An electrostatic chuck 26 as a means for temporarily fixing the target object to a predetermined position is arranged on the upper surface of the susceptor main body 24, i.e., a support surface 22A of the susceptor 22. The electrostatic chuck 26 is constituted by a pair of carbon electrodes 26A and 26B having insulating films formed on their surfaces. As shown in FIG. 2, DC power supplies 27 are electrically connected to the electrodes 26A and 26B of the electrostatic chuck 26 via switches 28, respectively. That is, the electrostatic chuck 26 of this embodiment is of a dipolar type. When the switches 28 are turned on in the electrostatic chuck 26 with the above arrangement, high-voltage DC currents are supplied from the DC power supplies 27 to the electrodes 26A and 26B to generate a Coulomb force between the electrodes 26A and 26B. By this Coulomb force, the semiconductor wafer W is held by the electrostatic chuck 26.

Figures 4, 5, 6:
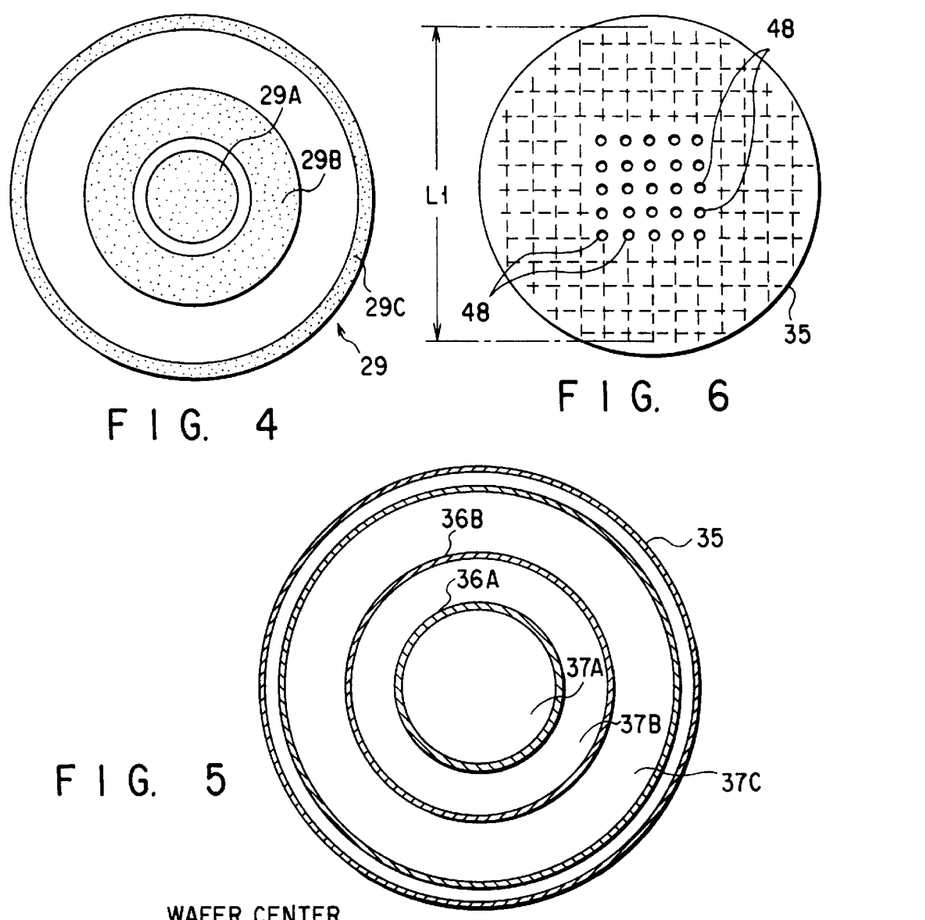
FIG. 4 is a plan view showing a heating means provided to the susceptor of the CVD apparatus shown in FIG. 2.
FIG. 5 is a sectional view showing the shower head section of the CVD apparatus shown in FIG. 2.
FIG. 6 is a plan view showing the shower head section of the CVD apparatus shown in FIG. 2.

As shown in FIG. 3, the susceptor main body 24 has a heating means 29. As shown in FIG. 4, the heating means 29 is divided into first to third heating means. A first heating means 29A having a substantially disk-like shape is arranged at substantially the central portion of the lower surface of the susceptor main body 24. A second heating means 29B has a ring-like shape whose center coincides with the center of the first heating means 29A. The second heating means 29B is spaced apart from the first heating means 29A so as to surround the first heating means 29A. A third heating means 29C having a substantially cylindrical shape is formed on the side wall surface of the susceptor main body 24. Each of the first to third heating means 29A to 29C is constituted by a resistance heating element such as a thin carbon plate.

The first to third heating means 29A to 29C are respectively connected to different heating means drive sections 30A to 30C. A central control section 31 constituted by, e.g., a microcomputer is connected to the heating means drive sections 30A to 30C.

Double heat insulators 32 and 33 having a substantially cylindrical shape are formed around the susceptor main body 24 with the above arrangement. A ring-like heat insulator 34 is formed over the upper ends of the heat insulators 32 and 33 and the upper end of the outer peripheral portion on the upper surface side of the susceptor 22 in the circumferential direction of the susceptor 22. The heat insulator 34 consists of, e.g., opaque silica and is divisible. The upper surface of the heat insulator 34 is set at the same horizontal level as that of the upper surface of the semiconductor wafer W. With this arrangement, an uneven flow of a processing gas can be preventing from being generated when the processing gas is supplied via a shower head section 35, as will be described later.

The susceptor 22 also comprises three pusher pins and the like (not shown) for transferring the semiconductor wafer W between the support surface 22A and a wafer convey arm.

The shower head section 35 is formed at the upper portion of the processing vessel 21. The shower head section 35 is arranged opposite and substantially parallel to the support surface 22A of the above susceptor 22. The shower head section 35 is a substantially cylindrical casing which consists of, e.g., aluminum and has two closed ends. As shown in FIG. 5, the interior of the shower head section 35 is divided by partitioning walls 36A and 36B arranged concentrically, thereby forming three gas chambers 37A to 37C. As shown in FIG. 2, gas supply pipes 38, 39, and 40 are independently connected to the gas chambers 37A to 37C. Gas supply sources 41, 42, and 43 for supplying silane ($SiH_4$) gas and argon (Ar) gas as processing gases and $ClF_3$ gas as a cleaning gas are connected to the gas supply pipes 38, 39, and 40 via branch pipes. Mass-flow controllers 44A to 44C are arranged between the gas supply pipes 38, 39, and 40 and the gas supply sources 41, 42, and 43 in correspondence with the respective gas supply pipes 38, 39, and 40. The mass-flow controllers 44A to 44C can individually manage the gas supply amounts to the corresponding gas supply pipes 38, 39, and 40. Opening/closing valves 45A to 45C capable of controlling the gas supply amounts to the gas supply pipes 38, 39, and 40 at one time are arranged on the gas output sides of the gas supply sources 41, 42, and 43.

A partitioning wall 46 is formed near the outer edge portion of the shower head section 35 to form a cooling jacket 47, as shown in FIG. 5. A means (not shown) for supplying a coolant such as water is connected to the cooling jacket 47. By the cooling jacket 47, the shower head section 35 is cooled to a temperature at which no film is formed, e.g., 60° C. or less.

A plurality of gas injection holes 48 for injecting a processing gas supplied to the gas chambers 37A to 37C are formed in the lower portion of the shower head section 35, e.g., a portion opposite to the support surface 22A of the susceptor 22. The diameter of each gas injection hole 48 is, e.g., 0.5 to 3 mm, and more specifically 2 mm. FIG. 5 is a plan view showing the lower surface of the shower head section 35. The gas injection holes 48 are formed in a matrix in the lower surface of the shower head section 35. The pitches of the gas injection holes 48 in the row and column directions are, e.g., 5 to 10 mm, and more specifically 8 mm. The gas injection holes 48 are formed almost uniformly. Therefore, the gas injection holes 48 are formed to obtain the same opening ratio per unit area. In other words, the number of gas injection holes 48 per unit area is the same when the diameters of the gas injection holes 48 are the same.

A diameter $L_1$ of a region on the lower surface of the shower head section 35 where the gas injection holes 48 are formed (to be referred to as a gas injection region hereinafter) is set equal to a diameter $L_2$ of a space region (to be referred to as a gas reaction region hereinafter) 49, above the susceptor 22, which is heated by the susceptor 22 having heated by the first to third heating means 29A to 29C to the reaction start temperature or more of a source gas. In this embodiment, the diameter $L_2$ of the gas reaction region 49 corresponds to the diameter of the third heating means 29C, i.e., to the diameter of the susceptor 22. In this embodiment, $L_1=L_2=20.5$ cm.

In this case, since both the horizontally sectional shapes of the susceptor 22 and the shower head section 35 are circular, the gas injection and reaction regions are also circular. Therefore, the diameters $L_1$ and $L_2$ of the gas injection and reaction regions are the maximum lengths of these regions.

A bottom cooling jacket 50 for allowing, e.g., cooling water as a coolant to flow therethrough is arranged on the bottom portion of the processing vessel 21. The bottom portion of the processing vessel 21 is cooled by the bottom cooling jacket 50 to a temperature at which no film is formed. A gate valve 51 which is opened/closed in loading/unloading the semiconductor wafer W is formed in the side wall of the processing vessel 21. In addition, the processing vessel 21 has an exhaust port 52 connected to a vacuum pump (not shown).

The operation of the CVD apparatus 20 with the above arrangement will be described.

In this CVD apparatus 20, it is difficult to rapidly increase/decrease the temperature because a relatively large heat capacity of the susceptor 22. For this reason, the susceptor 22 is heated by supplying currents to the heating means 29A to 29C during operation of the CVD apparatus 20.

The semiconductor wafer W transferred from a load-lock chamber (not shown) in accordance with preset programs is loaded in the processing vessel 21 by a convey arm (not shown) via the gate valve 51. The loaded semiconductor wafer W is placed at a predetermined position on the support surface 22A of the susceptor 22. High-voltage DC currents are supplied from the DC power supplies 27 to the pair of the carbon electrodes 26A and 26B of the electrostatic chuck 26 to generate a Coulomb force. The wafer W is held by the Coulomb force generated between the carbon electrodes 26A and 26B.

When the semiconductor wafer W is placed on the susceptor 22 in this manner, silane gas as a source gas together with argon gas as a carrier gas is supplied into the processing vessel 21 via the shower head section 35 while keeping the semiconductor wafer W at a predetermined process temperature, e.g., about 650° C. The interior of the processing vessel 21 is kept at a predetermined process pressure, e.g., about 10 Torr. With this operation, a polysilicon film is formed on the surface of the semiconductor wafer W. In this manner, a film is formed on the semiconductor wafer W.

After a predetermined number of semiconductor wafers W are processed, cleaning is performed to remove films attached to the interior of the processing vessel 21 and prevent generation of particles. More specifically, a dummy wafer for cleaning is placed on the support surface 22A of the susceptor 22, and then $ClF_3$ gas as a cleaning gas is supplied into the processing vessel 21 via the shower head section 35. This cleaning is periodically performed. During this cleaning, the shower head section 35 and the bottom portion of the processing vessel 21 are held at a temperature at which no film is formed, by the cooling jacket 47 of the shower head section 35 and the bottom cooling jacket 50 of the processing vessel 21.

In the above film formation step, in the CVD apparatus 20, the diameter $L_1$ of the gas injection region on the lower surface of the shower head section 35 is set equal to the diameter $L_2$ of the gas reaction region 49, as described above. When the source gas is supplied while the heating means 29A to 29C heat the semiconductor wafer W to the predetermined process temperature, a film formation reaction occurs within only the region above the susceptor 22 which is heated by the heating means 29A to 29C, as described above. Therefore, the gas supply amount per unit area can be set substantially equal to the gas consumption in the film formation step by setting the diameter of the region to which a processing gas is supplied to be equal to that of the gas reaction region 49. As a result, the in-plane uniformity of the film thickness of a film formed on the semiconductor wafer W can be improved. Note that the diameter $L_1$ of the gas injection region need not be perfectly equal to the diameter $L_2$ of the gas reaction region and may be ±5% the diameter $L_2$.

The results of a simulation will now be described. This simulation was executed to prove the relationship between the in-plane uniformity of the film thickness and the diameters $L_1$ and $L_2$ of the gas injection region and the gas reaction region 49 which are equal to each other.

Figure 7:
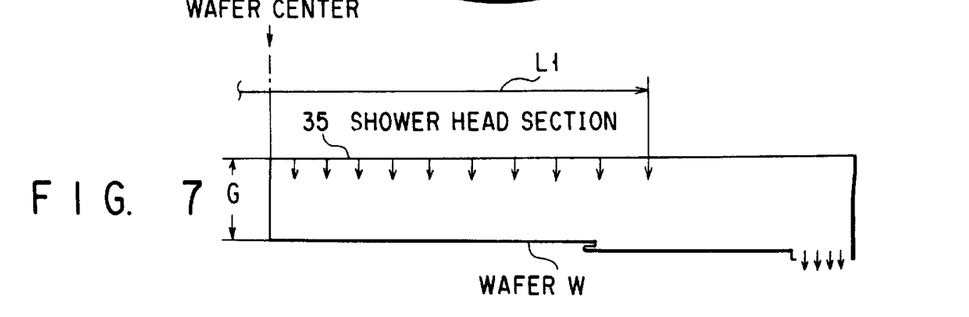
FIG. 7 is an explanatory view showing a model symmetrical about a cylinder shaft in a simulation executed to prove the effect of the present invention.
Figure 8:
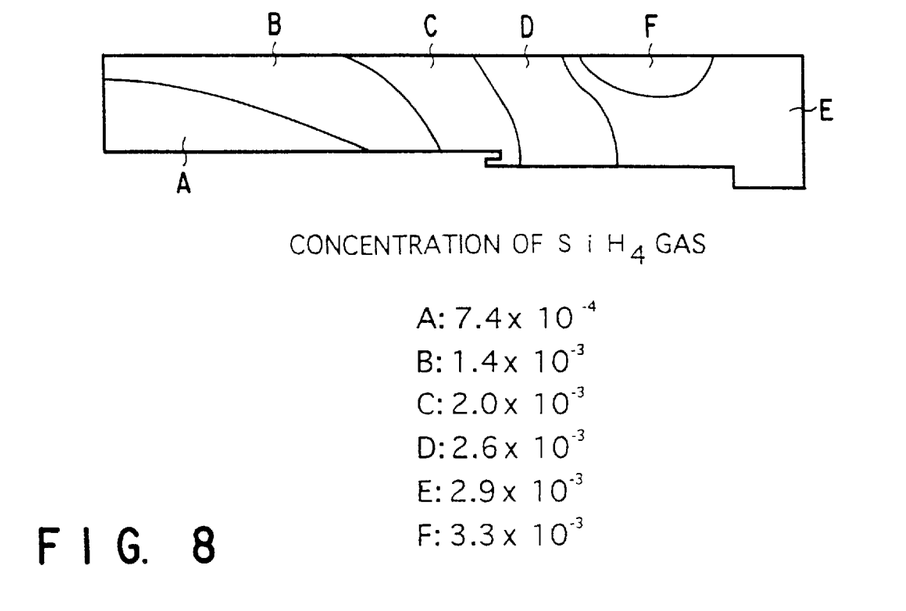
FIGS. 8 to 11 are explanatory views showing the results of the simulation executed to prove the effect of the present invention.
Figure 9:
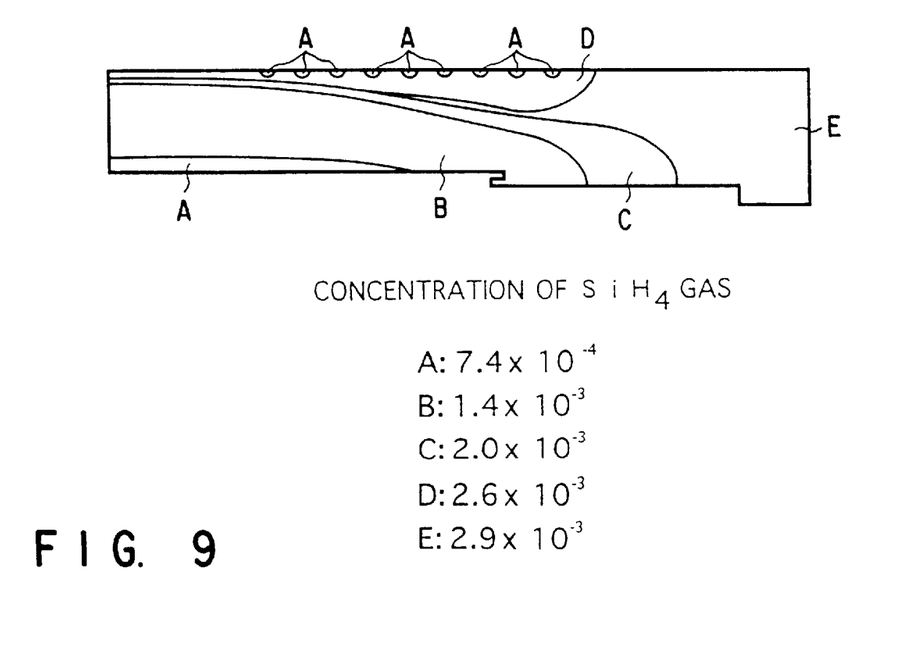

This simulation was performed on the basis of a model symmetrical about a cylinder shaft, as shown in FIG. 7. In this model, a gap G between the shower head section 35 and the wafer W was set at 40 mm. The process conditions were as follows.

Processing gas: $SiH_4$
Carrier gas: $H_2$
Type of formed film: polysilicon film
Concentration of processing gas: 2 vol %
  Pressure: 665 Pa (5 Torr)
  Flow rate: 500 SCCM
Process temperature: 600 to 800° C.
Note that the process temperature is uniform on the surface of the wafer W.

In this model, the diameter $L_1$ of the gas injection region of the shower head section 35 was changed into four values: 280, 216, 200, and 184. On the other hand, the diameter of the wafer W corresponding to the diameter $L_2$ of the gas reaction region was set at 200 mm in this model.

Figure 12:
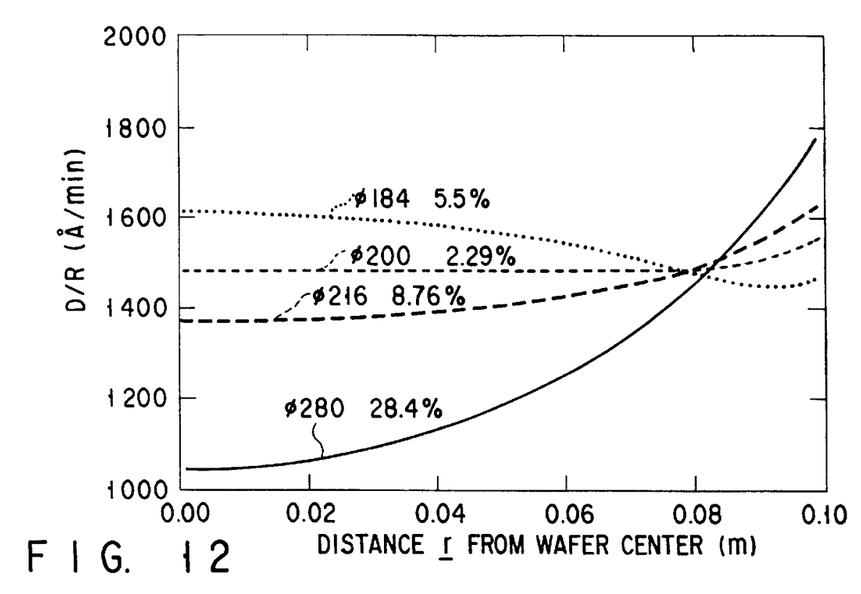
FIG. 12 is a graph showing the relationship between a distance r from the wafer center and the deposition rate D/R of polysilicon.

FIGS. 8 to 11 show the simulation results of the distributions of the processing gas concentration for the respective diameters $L_1$ in the above model. FIG. 12 shows the film thickness distribution for the respective diameters $L_1$.

Figure 10:
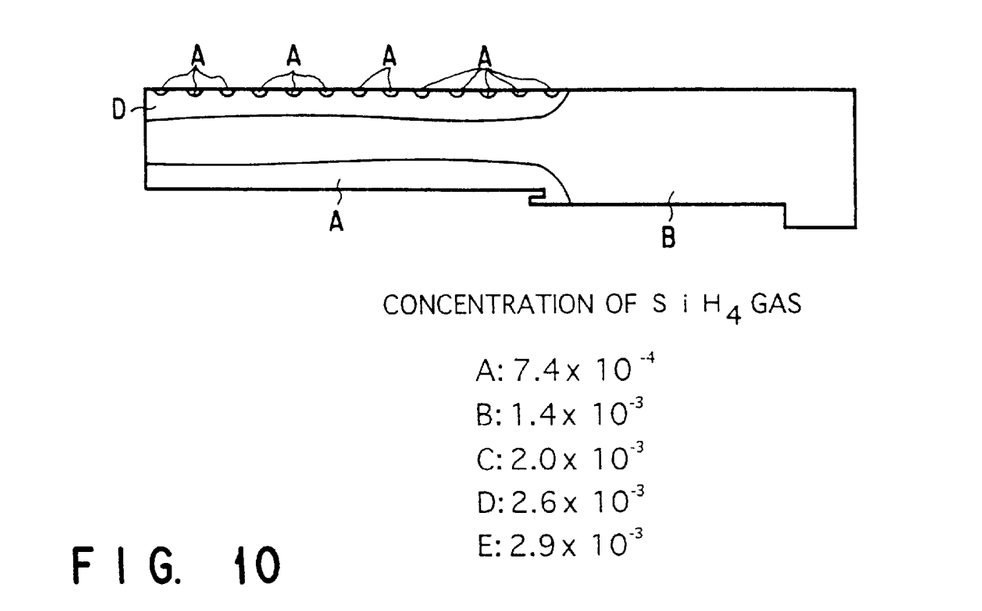
Figure 11:
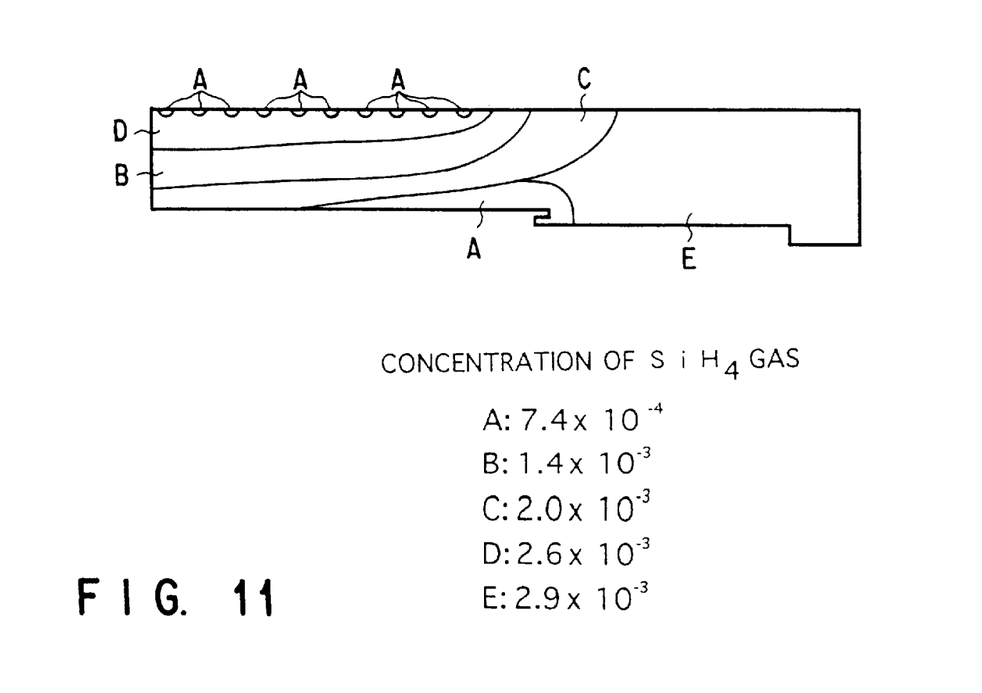
Figure 13:
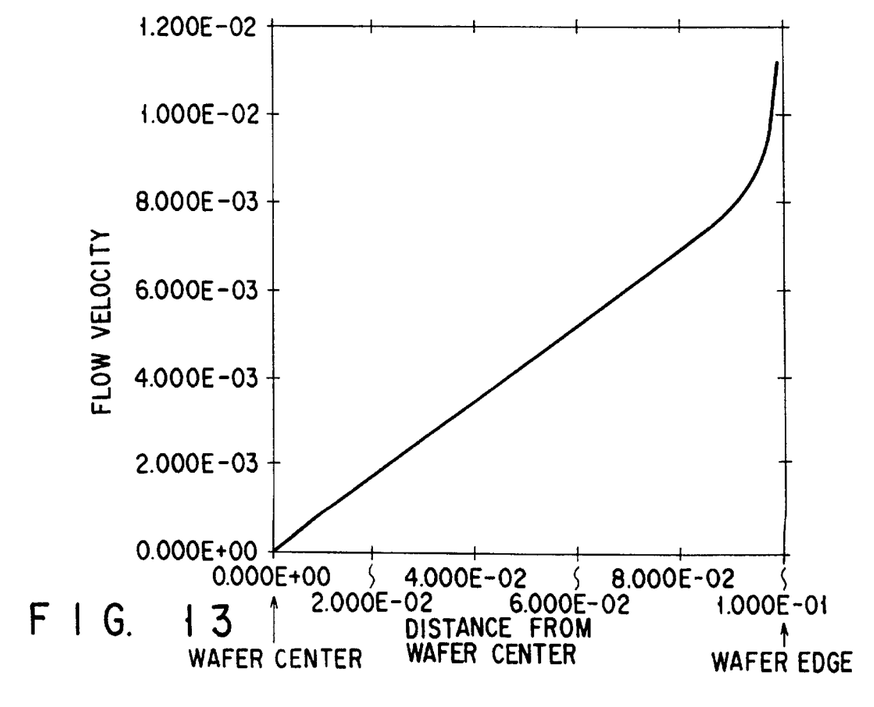
FIG. 13 is a graph showing the relationship between the distance from the wafer center and a processing gas.

From these results, it was found that the in-plane uniformity of a film formed on a wafer was the highest when the diameter $L_1$ of the gas injection region was equal to the diameter $L_2$ of the gas reaction region, i.e., in the case shown in FIG. 10. The reason is that the process pressure is high in the one-by-one type CVD apparatus, so that the gas flow velocity is very low, and the gas diffusion rate greatly influences the gas distribution, as shown in FIG. 13.

In the CVD apparatus 20 of this embodiment, the gas injection holes 48 are formed in a matrix in the lower surface of the shower head section 35, as described above. The pitches of the gas injection holes 48 in the row and column directions are almost uniform. Therefore, the gas injection holes 48 are formed to obtain the same opening ratio per unit area. With this arrangement, the gas supply amount injected from the gas injection holes 48 becomes uniform on the surface of the wafer W. As a result, the in-plane uniformity of the film thickness of the film formed on the semiconductor wafer W can be improved.

Figure 14:
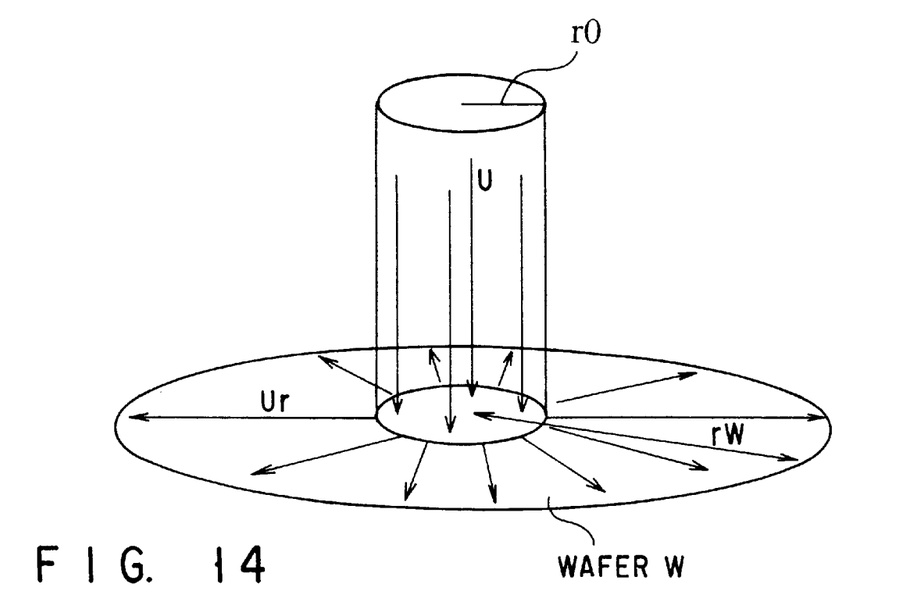
FIG. 14 is a schematic view showing the relationship between the radius of a gas opening portion and the flow velocity on the surface of a wafer W.

When a gas is supplied via the shower head section 35, the radius of a gas supply port determines the distribution of the radial gas flow velocity of the wafer W upon supply of the gas onto the surface of the wafer W. As shown in FIG. 14, it is defined that the radius of the gas injection port is r0, the radius of the wafer W is rw, and the gas is supply at a flow rate Q. If rw>r0, a radial flow velocity $U_r$ at a point apart from the center of the wafer W by a distance r on the surface of the wafer W is as follows. Assume that Qe is a gas supply amount per unit area when the gas is uniformly supplied to the surface of the wafer W. If r<r0, equation (1) is established:

$$Qe = \frac{Q}{\pi r0^2} \tag{1}$$

Assuming that U is the flow velocity at the gas supply port, equation (2) is established:

$$U = \frac{Q}{\pi r0^2} \tag{2}$$

Equations (1) and (2) yield equation (3):

$$Qe = U \tag{3}$$

A total gas flow rate Qr supplied from the center of the wafer W to the position r is expressed by equation (4):

$$Qr = Qe\ \pi r^2 = U\pi r^2 \tag{4}$$

The flow rate of the gas passing a unit sectional area $2\pi r$ in the radial direction of the wafer W, i.e., the flow velocity $U_r$ is given by equation (5):

$$U_r = \frac{U\pi r^2}{2\pi r} = \frac{1}{2}U_r \tag{5}$$

Therefore, if r<r0, the radial flow velocity increases in proportion to r.

To the contrary, if r0<r, no gas is supplied. For this reason, the flow velocity $U_r$ is given by equation (6):

$$U_r = \frac{U\pi r0^2}{2\pi r} = \frac{1}{2}U_r 0^2 \frac{1}{r} \tag{6}$$

Therefore, the flow velocity $U_r$ decreases in inverse proportion to r. From these results, it is found that the gas flow state greatly changes depending on the diameter of the gas supply port.

Next, the relationship between the gas flow velocity and heat transfer between the gas and the wafer will be considered. When the in-plane temperature of the wafer W is almost uniform, a heat transfer coefficient hr between the wafer W and the gas flowing at the constant radial flow velocity $U_r$ on the surface of the wafer W is experientially expressed by equations (7) and (8):

$$hr = \frac{Nu\lambda}{r} \tag{7}$$

where hr: the heat transfer coefficient, and $\lambda$: the thermal conductivity of the gas.

$$Nu_r = 0.332(Pr)^{1/3}(Re r)^{1/2} \tag{8}$$

where Re=$U_r$r: the Reynolds number
Pr=v: the Prandtl number
Nu: the Nusselt number
v: the kinematic viscosity
Equations (7) and (8) yield equation (9):

$$Hr = 0.332\ (Pr)^{\frac{1}{3}}(v)^{\frac{1}{2}}\sqrt{\frac{U_r}{r}} \tag{9}$$

From equation (9), if the flow velocity $U_r$ is constant, the heat transfer coefficient hr is decreased with $$\frac{1}{\sqrt{r}}$$

in r.

Therefore, the heat transfer coefficient hr at the center becomes greatly different from that at the end portion of the wafer W. In other words, a temperature boundary layer becomes thicker from the center of the wafer W to its end portion. The difference in the heat transfer coefficient greatly depends on the flow rate.

When the diameter of the gas supply port is larger than that of the wafer W (r0<r), the flow velocity $U_r$ linearly functionally increases with respect to r.

For this reason, $$\sqrt{\frac{U_r}{r}}$$

in equation (9) is constant, and the heat transfer coefficient hr on the surface of the wafer W becomes constant. In other words, the temperature boundary layer having a uniform thickness is formed on the surface of the wafer W. Therefore, it is found that the heat transfer coefficient at the center can be ensured equal to that at the end portion of the wafer W even at any gas flow rate.

The above logic is established on the assumption that the gas is supplied from the gas supply port at the same flow rate per unit area. Therefore, the gas supply port must be a shower head section having a plurality of gas injection holes. In addition, the gas injection holes must be formed in the shower head section 35 so as to obtain the same opening ratio per unit area, as described above. In the above description, attention is paid to realization of a uniform temperature boundary layer. When the temperature boundary layer is uniform, it is apparent that a rate boundary layer and a concentration boundary layer on the surface of the wafer are also uniform.

In this case, the same opening ratio per unit area includes not only perfectly the same opening ratio but also an opening ratio with an error of ±5% or less.

Figure 15:
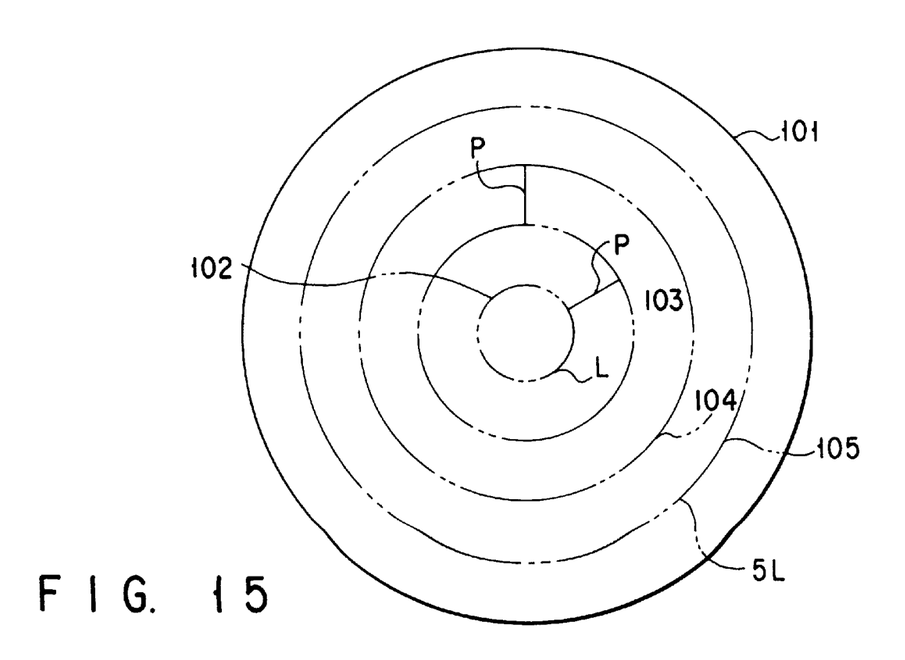
FIG. 15 is a plan view showing another example of the array of the gas injection holes of the shower head section.

This embodiment exemplifies the case in which the gas injection hole 48 are formed in a matrix in the shower head section 35. However, the present invention is not limited to this as far as the same opening ratio per unit area is obtained. For example, as shown in FIG. 15, gas injection holes having the same diameter are concentrically arrayed at the positions of circles 102 to 105 indicated by imaginary lines on the lower portion of a shower head section 101. The respective circles 102 to 105 have the same interval P therebetween. The gas injection holes on the same circle are aligned at almost the same pitch in the circumferential direction.

The respective numbers of gas injection holes formed on the circles 102 to 105 are directly proportional to the circumferences of the circles 102 to 105. That is, assume that the circumference of the innermost circle 102 is L, and that of the outermost circle 105 is 5L. If the number of gas injection holes formed on the circle 102 is $\underline{n}$, the number of gas injection holes formed on the circle 105 is 5n.

In general, the heat dissipation amount of the susceptor 22 changes in the radial direction. That is, the peripheral edge portion of the susceptor 22 has a heat dissipation amount larger than those of remaining portions. Therefore, the temperature of the peripheral edge portion of the susceptor 22 is lower than those of the remaining portions. The variation in heat dissipation amount is the cause of a reduction in in-plane uniformity of the film thickness of a film formed on the wafer W.

To solve this problem, the heat insulators 32 and 33 are arranged around the susceptor main body 24 in the CVD apparatus 20 of this embodiment to reduce the heat dissipation amount from the peripheral edge portion of the susceptor 22, as shown in FIG. 3. However, the difference between the heat dissipation amounts cannot be completely eliminated by the heat insulators 32 and 33. For this reason, in the CVD apparatus 20, the first to third heating means 29A to 29C divided concentrically are provided to the susceptor main body 24 of the susceptor 22, as shown in FIG. 3. In addition, as shown in FIG. 2, the heating means drive sections 30A to 30C are independently connected to the first to third heating means 29A to 29C, respectively. The heating means drive sections 30A to 30C can be independently controlled by the central control section 31. The susceptor 22 is concentrically divided into three zones whose temperatures can be independently controlled. Since the temperature of the susceptor 22 can be controlled for each divided zone, the temperature of the susceptor 22 can be controlled with a high precision.

With this arrangement, the temperature of the peripheral edge portion of the susceptor 22, i.e., the temperature of a zone corresponding to the third heating means 29C can be set higher than those of zones corresponding to the first and second heating means 29A and 29B. Therefore, a temperature distribution in which the temperature of the peripheral edge portion is slightly higher than that of the central portion can be positively generated in the susceptor 22. The temperature of the peripheral edge portion of the susceptor 22 can be compensated to improve nonuniformity in the in-plane temperature of the wafer W caused by the difference in heat dissipation amount between the peripheral edge portion and central portion of the susceptor 22. As a result, the in-plane uniformity of the film thickness of the film formed on the wafer W can be improved.

In this embodiment, the susceptor 22 is divided into three zones, and each zone is heated. If a larger number of heating means is used, the susceptor 22 can be divided into a larger number of zones, e.g., four or five zones, and each zone can be heated. In this case, the temperature of the susceptor 22 can be controlled with a higher precision.

In addition, thermocouples can be respectively provided to the zones corresponding to the first to third heating means 29A to 29C, thereby detecting the temperatures of the respective zone.

Further, in the CVD apparatus 20 of this embodiment, the peripheral edge portion of the susceptor main body 24 has a leg portion 24A thicker than the central portion, as shown in FIG. 3. The third heating means 29C is arranged to cover the side wall surface of the leg portion 24A. With this structure, an attachment area for the third heating means 29C is enlarged to increase the heat quantity applied to the leg portion 24A of the susceptor main body 24 more than that to the central portion. At the same time, the heat capacity of the leg portion 24A of the susceptor main body 24 is set larger than that of the central portion. With this structure, the heat dissipation amount at the peripheral edge portion of the susceptor 22 is reduced, and a heat loss by heat dissipated from the peripheral edge portion of the susceptor 22 is compensated.

In the CVD apparatus 20 of this embodiment, a heat loss from the leg portion 24A can be reduced by setting a thickness $L_4$ of the leg portion 24A of the susceptor main body 24 to be equal to a thickness $L_3$ of the central portion so as to decrease the area of the bottom surface of the leg portion 24A which contacts the heat insulator 32.

In the CVD apparatus 20 of this embodiment, the interior of the shower head section 35 is divided into the three concentrical gas chambers 37A to 37C, as shown in FIG. 5. A processing gas can be independently supplied to the respective gas chambers 37A to 37C. The supply amounts of the processing gas to the respective gas chambers 37A to 37C can be independently controlled by the mass-flow controllers 44A to 44C. Therefore, the gas reaction region 49 in the processing vessel 21 can be divided into three zones, and the processing gas can be supplied while changing the supply amounts for the respective zones. As a result, the gas supply amount per unit area to the wafer W can be arbitrarily changed for each zone, unlike a shower head section with a conventional structure in which the interior is not divided. Accordingly, various types of films can be formed in various processes with high in-plane uniformity.

Although the above embodiment uses silane gas as a source gas, the present invention is not limited to this, and another source gas such as disilane gas can be used. As for a carrier gas, an inert gas such as nitrogen gas, helium gas, or xenon gas can be used in addition to argon gas.

Although the heating resistor is used for heating in the above embodiment, lamp irradiation and the like can be used for heating.

Although the above embodiment exemplifies the resistance heating type CVD apparatus, the present invention can be applied to another heat-processing apparatus.

Further, although a semiconductor wafer is used as a target object in the above embodiment, the target object is not limited to this, and a glass substrate and a polymeric substrate can be used.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for heat-processing target objects one by one to from a film thereon, comprising:

a processing vessel for accommodating a target object;

a susceptor arranged in said processing vessel and having a support surface for placing said target object;

a shower head section arranged spaced apart from said support surface;

processing gas supply means for supplying a processing gas to said shower head section;

a plurality of gas injection holes formed on a face of said shower head section which faces said susceptor, said gas injection holes being arranged in a region defined as a gas injection region having a plan-view outer contour; and heating means attached to said susceptor, for heating said susceptor, wherein said heating means comprises an inner heater arranged on said susceptor to face said support surface with a body of said susceptor sandwiched therebetween, and an outer heater arranged on a side wall of said susceptor to surround said side wall, said outer heater having a plan-view outer contour which defines a plan-view outer contour of a gas reaction region to be heated to at least a temperature at which said processing gas starts reaction, wherein said plan-view outer contours of said gas injection region and said gas reaction region are substantially the same in shape as each other and substantially concentric with each other.

2. An apparatus according to claim 1, wherein the plurality of gas injection holes are formed in the gas injection region so as to obtain substantially the same opening ratio per unit area.

3. An apparatus according to claim 2, wherein the plurality of gas injection holes are formed in the gas injection region such that diameters of the plurality of gas injection holes are substantially equal to each other, and the number of gas injection holes per unit area is substantially predetermined.

4. An apparatus according to any one of claims 2 and 3, wherein the plurality of gas injection holes are arrayed in the gas injection region at substantially the same pitch.

5. An apparatus according to any one of claims 2 and 3, wherein the plurality of gas injection holes are arrayed in a matrix.

6. An apparatus according to any one of claims 2 and 3, wherein the plurality of gas injection holes are aligned on imaginary circles concentrically arranged in the gas injection region at substantially the same interval, the gas injection holes aligned on the same circle are aligned at substantially the same pitch, and the number of gas injection holes aligned on one circle is directly proportional to a circumference of the circle.

7. The apparatus according to claim 1, wherein said plan-view outer contours of said gas injection region and said gas reaction region are circular.

8. The apparatus according to claim 7, wherein said outer heater is cylindrical.

9. The apparatus according to claim 8, wherein said inner heater comprises first and second heater segments arranged substantially concentric with each other.

10. The apparatus according to claim 8, further comprising a controller for controlling said inner and outer heaters independently of each other.

11. The apparatus according to claim 10, wherein said controller controls said inner and outer heaters such that a temperature of a portion heated by said outer heater is higher than that of a portion heated by said inner heater.

12. The apparatus according to claim 1, wherein said shower head section comprises a top plate, a bottom plate, and a plurality of partition walls extending between said top and bottom plates, said partition walls being arranged concentrically to form a plurality of gas rooms concentrically in said shower head section, said processing gas supply means comprising substantially equivalent supply lines connected to said gas rooms, respectively, which are controllable independently of each other on supply rates of said processing gas.

13. An apparatus for heat-processing target objects one by one to form a film thereon, comprising:

a processing vessel for accommodating a target object;

a susceptor arranged in said processing vessel and having a support surface for placing said target object;

a shower head section arranged spaced apart from said support surface;

processing gas supply means for supplying a processing gas to said shower head section;

a plurality of gas injection holes formed on a face of said shower head section which faces said susceptor, said gas injection holes being arranged in a region defined as a gas injection region having a plan-view outer contor; and heating means attached to said susceptor, for heating said susceptor, wherein said heating means defines a plan-view outer contour of a gas reaction region to be heated to at least a temperature at which said processing gas starts reaction, and said plain-view outer contours of said gas injection region and said gas reaction region are substantially the same in shape as each other and are substantially concentric with each other, wherein said shower head section comprises a top plate, a bottom plate, and a plurality of partition walls extending between said top and bottom plates, said partition walls being arranged concentrically to form a plurality of gas rooms concentrically in said shower head section, said processing gas supply means comprising substantially equivalent supply lines directly connected to said gas rooms, respectively, which are controllable independently of each other as to supply rates of said processing gas.

14. An apparatus according to claim 13, wherein the plurality of gas injection holes are formed in the gas injection region so as to obtain substantially the same opening ratio per unit area.

15. An apparatus according to claim 14, wherein the plurality of gas injection holes are formed in the gas injection region such that diameters of the plurality of gas injection holes are substantially equal to each other, and the number of gas injection holes per unit area is substantially predetermined.

16. An apparatus according to any one of claims 14 and 15, wherein the plurality of gas injection holes are arrayed in the gas injection region at substantially the same pitch.

17. An apparatus according to any one of claims 14 and 15, wherein the plurality of gas injection holes are arrayed in a matrix.

18. An apparatus according to any one of claims 14 and 15, wherein the plurality of gas injection holes are aligned on imaginary circles concentrically arranged in the gas injection region at substantially the same interval, the gas injection holes aligned on the same circle are aligned at substantially the same pitch, and the number of gas injection holes aligned on one circle is directly proportional to a circumference of the circle.

19. The apparatus according to claim 13, wherein said plan-view outer contours of said gas injection region and said gas reaction region are circular.

20. The apparatus according to claim 19, wherein said partition walls are cylindrical.

21. The apparatus according to claim 20, wherein said heating means comprises an inner heater arranged on said susceptor to face said support surface with a body of said susceptor sandwiched therebetween, and an outer heater arranged on a side wall of said susceptor to surround said side wall, said outer heater having a plan-view outer contour which defines said plan-view outer contour of said gas reaction region.

22. The apparatus according to claim 21, wherein said outer heater is cylindrical.

* * * * *